(12) United States Patent
Witcraft et al.

(10) Patent No.: US 7,046,547 B2
(45) Date of Patent: May 16, 2006

(54) MAGNETIC NON-VOLATILE MEMORY COIL LAYOUT ARCHITECTURE AND PROCESS INTEGRATION SCHEME

(75) Inventors: William Frank Witcraft, Minneapolis, MN (US); Hongyue Liu, Plymouth, MN (US); Joel E. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/204,921

(22) Filed: Aug. 16, 2005

(65) Prior Publication Data

US 2005/0270831 A1 Dec. 8, 2005

Related U.S. Application Data

(60) Continuation of application No. 11/010,671, filed on Dec. 13, 2004, now Pat. No. 6,961,265, which is a division of application No. 10/837,476, filed on Apr. 30, 2004, now Pat. No. 6,845,036, which is a division of application No. 10/228,619, filed on Aug. 27, 2002, now Pat. No. 6,771,533.

(51) Int. Cl.
   *G11C 11/00* (2006.01)
(52) U.S. Cl. .................. 365/158; 365/171; 365/173
(58) Field of Classification Search ............ 365/158, 365/171, 173
   See application file for complete search history.

(56) References Cited

U.S. PATENT DOCUMENTS

| 5,732,016 | A | 3/1998 | Chen et al. | |
|---|---|---|---|---|
| 5,734,606 | A | 3/1998 | Tehrani et al. | |
| 5,923,583 | A | 7/1999 | Womack | |
| 6,005,800 | A * | 12/1999 | Koch et al. | 365/173 |
| 6,391,483 | B1 * | 5/2002 | Zhu et al. | 428/810 |
| 6,424,561 | B1 * | 7/2002 | Li et al. | 365/158 |
| 6,522,579 | B1 * | 2/2003 | Hoenigschmid | 365/173 |
| 6,693,823 | B1 | 2/2004 | Brown | |

OTHER PUBLICATIONS

Daughton, James M., "Advanced MRAM Concepts" Article from NVE Corporation, Feb. 7, 2001, pp. 1-6.

Lee, et al., "Separation of Contributions to Spin Valve Interlayer Exchange Coupling Field by Temperature Dependent Coupling Field Measurements" [online] 46th MMM Conference, Seattle, Washington 2001 pp. 1-16 [retrieved on Jan. 25, 2002] Retrieved from the Internet: <URL:www.andrew.cmu.edu/~zlee/mmm.pdf>.

(Continued)

*Primary Examiner*—Anh Phung
(74) *Attorney, Agent, or Firm*—Knobbe Martens Olson & Bear LLP

(57) ABSTRACT

The invention relates to methods and apparatus that allow data to be stored in a magnetic memory cell, such as a giant magneto-resistance (GMR) cell, of a magnetoresistive random access memory (MRAM). Embodiments of the invention advantageously wind a word line around a magnetic memory cell to increase the magnetic field induced by the word line. The word line can be formed by connecting a segment in a first layer to a segment in a second layer with the memory cell disposed between the first layer and the second layer. Advantageously, embodiments of the invention can include relatively narrow magnetic memory cells, and/or bit lines, have relatively high write selectivity, and can use relatively low word currents to store data. In one MRAM, current is passed through a word line by allowing current to flow through a corresponding word row line and a corresponding word column line.

6 Claims, 13 Drawing Sheets

OTHER PUBLICATIONS

"Magnetoelectronics" [online] [retrieved on Jan. 25, 2002] Retrieved from the Internet: <URL: www.ipm.virginia.edu/research/ PVD/Pubs/thesis7/chapter2.PDF> Chapter 2 pp. 7-34.

"Non-Volatile Memory (MRAM)" *ANXXX* [online] Honeywell <retrieved on Nov. 19, 2001> <URL:www.ssec.honeywell.com/avionics/h_gmr.pdf> pp. 1-4.

* cited by examiner

US 7,046,547 B2

MAGNETIC NON-VOLATILE MEMORY COIL LAYOUT ARCHITECTURE AND PROCESS INTEGRATION SCHEME

RELATED APPLICATION

This application is a continuation application of U.S. application Ser. No. 11/010,671, filed Dec. 13, 2004 now U.S. Pat. No. 6,961,265, issued on Nov. 1, 2005, which is a divisional application of U.S. application Ser. No. 10/837,476, filed on Apr. 30, 2004, now U.S. Pat. No. 6,845,036, issued on Jan. 18, 2005, which is a divisional application of U.S. application Ser. No. 10/228,619, filed on Aug. 27, 2002, now U.S. Pat. No. 6,771,533, issued on Aug. 3, 2004 the disclosures of which are hereby incorporated by reference in their entireties herein.

BACKGROUND OF THE INVENTION

1. Field of the Invention

The invention generally relates to memory technology. In particular, the invention relates to non-volatile magnetic memory.

2. Description of the Related Art

Computers and other digital systems use memory to store programs and data. A common form of memory is random access memory (RAM). Many memory devices, such as dynamic random access memory (DRAM) devices and static random access memory (SRAM) devices are volatile memories. A volatile memory loses its data when power is removed. For example, after a conventional personal computer is powered off, the volatile memory is typically reloaded through a boot up process upon a restart. In addition, certain volatile memories such as DRAM devices require periodic refresh cycles to retain their data even when power is continuously supplied.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable PROM (EPROM), electrically erasable PROM (EEPROM), flash memory, and the like. Disadvantageously, conventional nonvolatile memories are relatively large, slow, and expensive. Further, conventional nonvolatile memories are relatively limited in write cycle capability and typically can only be programmed to store data about 10,000 times in a particular memory location. This prevents a conventional non-volatile memory device, such as a flash memory device, from being used as general purpose memory.

An alternative memory device is known as magnetoresistive random access memory (MRAM). An MRAM device uses magnetic orientations to retain data in its memory cells. Advantageously, MRAM devices are relatively fast, are nonvolatile, consume relatively little power, and do not suffer from a write cycle limitation. There are at least three different types of MRAM devices, including giant magneto-resistance (GMR) MRAM devices, magnetic tunnel junction (MTJ) or tunneling magneto-resistance (TMR) MRAM devices, and pseudo spin valve MRAM devices. GMR MRAM devices separate at least two ferromagnetic layers with a metallic layer. In a MTJ MRAM device, at least two ferromagnetic layers are separated by a thin insulating tunnel barrier. A pseudo spin valve MRAM device uses an asymmetric sandwich of the ferromagnetic layers and metallic layer as a memory cell, and the ferromagnetic layers do not switch at the same time.

One problem that has plagued conventional MRAM devices is relatively low write selectivity. In a conventional MRAM device, the magnetic field applied to a selected memory cell is relatively weakly coupled to the selected cell. This undesirably results in relatively high currents to generate a magnetic field, which is used to write to the cell. The required amounts of current can be higher than desired for relatively high-density integrated circuits. In addition, the magnetic field applied to the selected cell can be undesirably coupled to another cell. This can undesirably cause the contents of an unselected cell to be overwritten.

Embodiments of the invention advantageously solve these and other problems by providing improved write selectivity.

SUMMARY OF THE INVENTION

The invention relates to methods and apparatus that allow data to be stored in a memory cell, such as a giant magneto-resistance (GMR) cell or a tunneling magneto-resistance (TMR) cell, of a magnetoresistive random access memory (MRAM). Embodiments of the invention advantageously wind a word line around the memory cell to increase the magnetic field induced by the word line. The word line can be formed by connecting a segment in a first layer to a segment in a second layer with the memory cell disposed between the segments in the first layer and the second layer. Advantageously, embodiments of the invention can be fabricated with relatively narrow memory cells and relatively narrow sense lines or bit lines. Embodiments of the invention exhibit relatively high write selectivity, and use relatively low word currents to store data. In one MRAM, current is selectively passed through a word line by allowing current to flow through a corresponding word row line and a corresponding word column line. The word row line and the word column line are also referred to in the art as a word line and a digit line, respectively.

One embodiment according to the invention includes a magnetic memory cell. The magnetic memory cell includes a cell body that stores data in a stored magnetic orientation. The cell body can correspond to a broad variety of giant magneto-resistance (GMR) types including a spin valve mode or a pseudo spin valve mode and can also correspond to a tunneling magneto-resistance (TMR) cell body. The cell body exhibits a first resistance when the stored magnetic orientation of a hard magnetic layer is aligned or is parallel with a magnetic orientation of a soft magnetic layer and a second resistance when the stored magnetic orientation is anti-parallel with the magnetic orientation of the soft magnetic layer. The magnetic memory cell further includes a conductive word line that forms at least part of one turn of a winding around the cell body. The conductive word line is electrically coupled at a first end to a word row line. At a second end, the conductive word line is electrically coupled to a word column line.

Another embodiment according to the invention includes a conductive word line for a magnetic memory cell, such as a giant magneto-resistance (GMR) cell. The conductive word line includes at least a first segment in a first layer and at least a second segment in a second layer. The first layer and the second layer are arranged relative to a cell body such that the cell body is disposed between the first segment and the second segment. The conductive word line further includes at least one plug, which electrically connects the first segment to the second segment. The first segment and the second segment form an angle of at least 10 degrees at the plug with respect to each other. The first segment can connect to a word row line or to a word column line.

Another embodiment according to the invention includes a magnetoresistive random access memory (MRAM). The MRAM includes a plurality of memory cell bodies, such as a plurality of GMR cell bodies, where a memory cell body stores a magnetic orientation to represent a logic state and has a first resistance when a stored magnetic orientation in a hard layer is aligned or is in parallel with a magnetic orientation in a soft layer, and a second resistance when the stored magnetic orientation in the hard layer is anti-parallel with the magnetic orientation of the soft layer. The memory cell bodies are arranged in an array. The MRAM further includes a plurality of word lines, where a word line wraps at least 270 degrees around a corresponding memory cell body. The MRAM includes a plurality of word row lines, where a word row line is electrically coupled to a first end of word lines of multiple memory cell bodies along multiple bit lines, such as sense lines, and the MRAM further includes a plurality of word column lines, where a word column line is electrically coupled to a second end of word lines of multiple GMR cell bodies corresponding to the same bit line. A word line for a particular memory cell body is energized by activating a corresponding word row line and a corresponding word column line.

Another embodiment according to the invention includes a magnetoresistive random access memory (MRAM). The MRAM includes a plurality of magnetic memory cell bodies, such as GMR cell bodies or TMR cell bodies, that are coupled to a plurality of bit lines. Word lines in the MRAM wrap individually wrap around cell bodies. Only one cell body per bit line is wrapped by a word line.

Another embodiment according to the invention includes a method of selecting a memory cell from a plurality of memory cells in a magnetoresistive random access memory (MRAM). The method includes passing current through a bit line corresponding to the memory cell, allowing current to pass through a word row line that is electrically coupled to a word line of the memory cell, and allowing current to pass through a word column line that is electrically coupled to a column line of the memory cell such that a word current passes through the word line of the memory cell.

Another embodiment according to the invention includes a method of producing a memory cell. The method includes forming a bit line with a body of the memory cell that can store a magnetic orientation in a hard layer to represent a logic state. The method further includes forming a word line that wraps around the bit line by at least 270 degrees and connects to a word row line and a word column line.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

A magnetoresistive random access memory (MRAM) stores data in magnetic states of its memory cells. The electrical resistance of the cell varies depending on the stored magnetic state of the cell. The stored state of the cell is detected by sensing the difference in resistance.

While illustrated in the context of giant magneto-resistance (GMR) memories, the skilled artisan will appreciate that the principles and advantages described herein are applicable to other types of magnetic memories, such as tunneling magneto-resistance (TMR) MRAMs.

Figure 1:
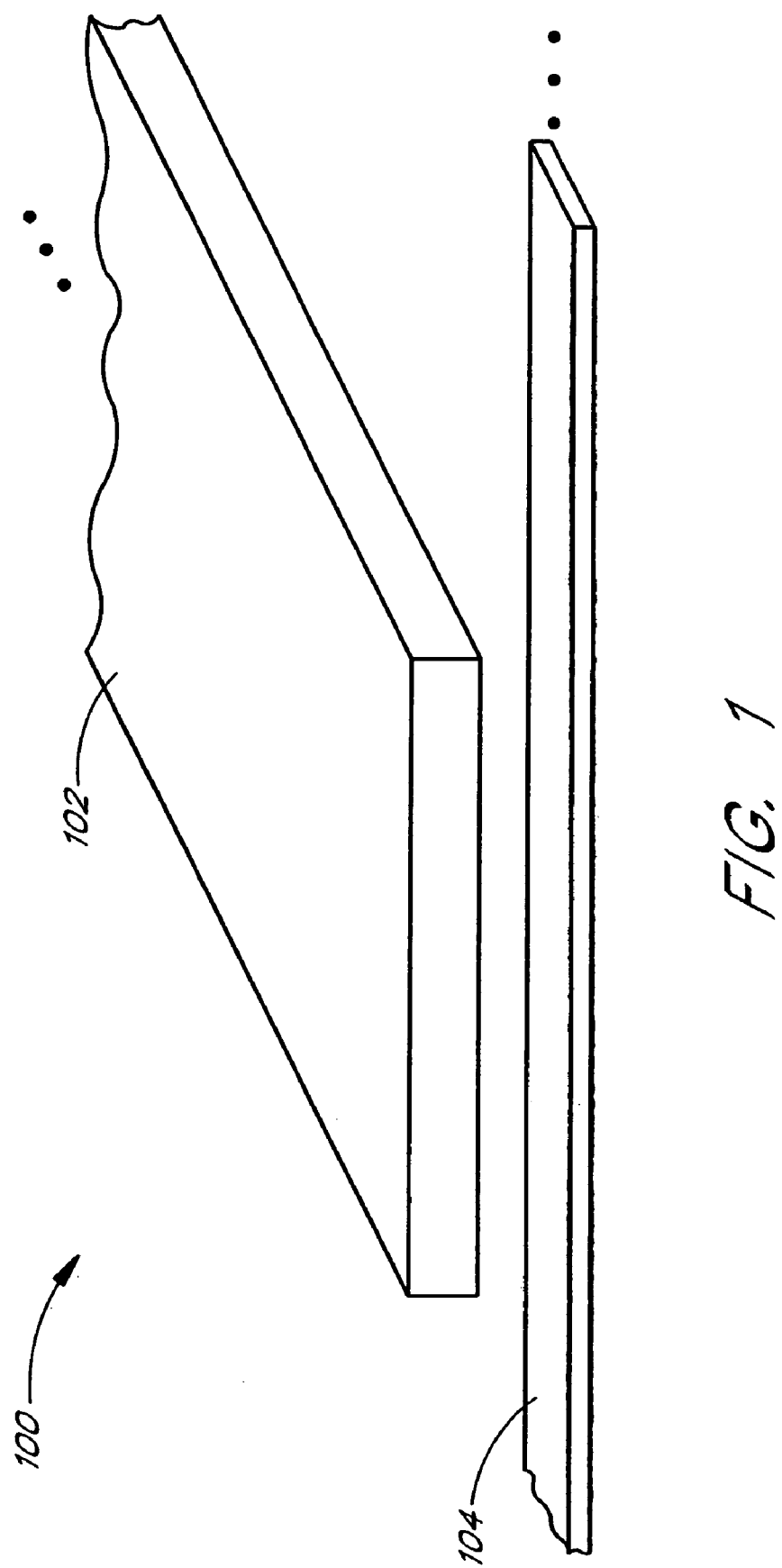
FIG. 1 is a perspective view illustrating a giant magneto-resistance (GMR) cell in a spin valve mode.

FIG. 1 is a perspective view illustrating a GMR cell 100 in a spin valve mode. The GMR cell 100 includes a word line 102 and a bit line 104. In a GMR cell, the bit line 104 is also known as a sense line. The bit line 104 contains magnetic layers. Data is stored in a cell body portion of the bit line 104 by simultaneously applying current through the word line 102 and the bit line 104. The direction of the currents in the word line 102 and in the bit line 104 (and the consequent magnetic field applied) determines the polarization of the magnetic orientation that stores the logical state of the data. For example, the applied field component from the bit line current can be clockwise around the bit line 104 for a first current direction, and counterclockwise around the bit line 104 for a second current direction, and similarly for the word line 102. The vector sum of the applied magnetic fields from the two (or more) conductive lines determines the magnetic state of the cell.

To read data from the GMR cell 100, currents are again applied to the word line 102 and the bit line 104 corresponding to the GMR cell 100. The resistance encountered by the current applied to the bit line 104 varies depending on the logical state stored in the magnetic layers. A cell with a larger resistance exhibits a larger voltage drop with the current than a cell with a smaller resistance. Where the magnetic memory cell corresponds to a tunneling magneto-resistance (TMR) configuration, a TMR cell is disposed between the bit line 104 and the word line 102 as will be described later in connection with FIG. 7.

Figure 2:
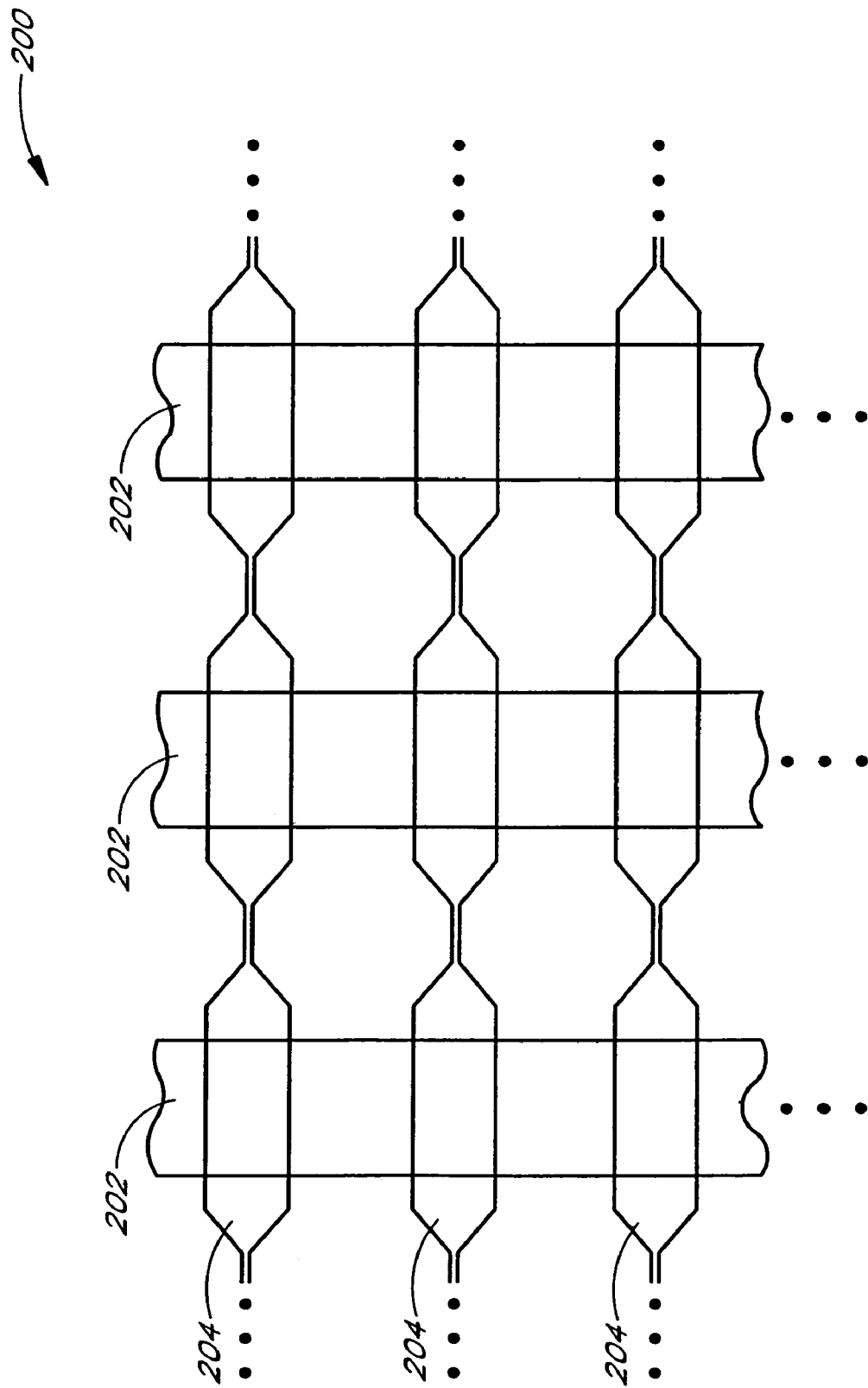
FIG. 2 is a schematic top-down view illustrating an array of GMR cells.

FIG. 2 is a schematic top-down view illustrating an array 200 of GMR cells. A plurality of cells are arranged into the array 200 in a memory device. The array 200 of cells includes a plurality of word lines 202 and a plurality of bit lines 204. An individual cell within the array 200 is selected by applying current through the corresponding word line and the corresponding bit line. Data is not stored or read in a cell where current flows through only one of the cell's word line or bit line.

Figure 3A:
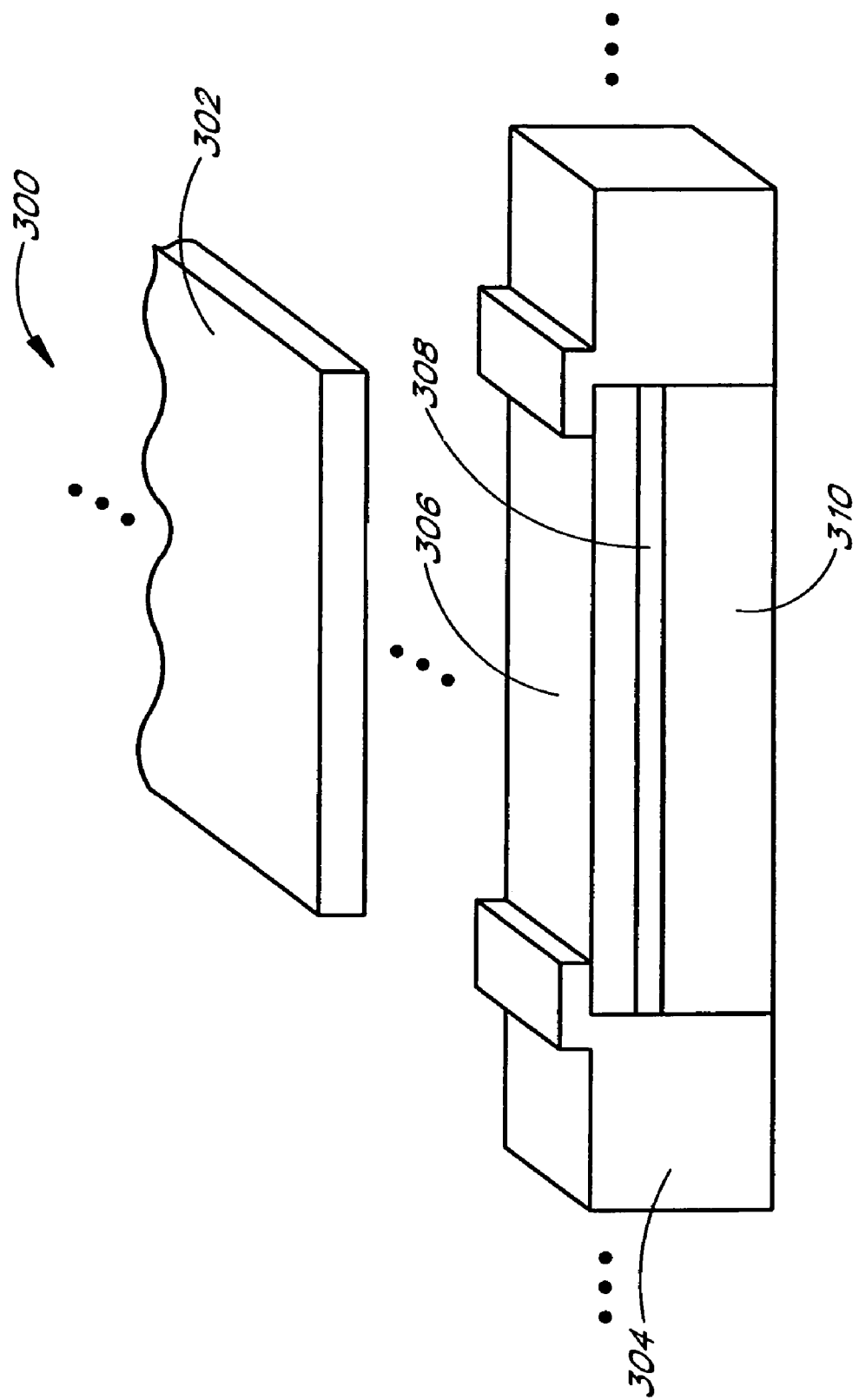
FIG. 3A illustrates a GMR cell in a pseudo spin valve (PSV) mode.

FIG. 3A illustrates a GMR cell 300 in a pseudo spin valve (PSV) mode. The GMR cell 300 includes a word line 302 and a bit line 304. The bit line 304 of the GMR cell 300, which is also known as a sense line, further includes a GMR stack including a first magnetic layer 306, a conductive layer 308, and a second magnetic layer 310. The first magnetic layer 306 and the second magnetic layer 310 are mismatched so that the first magnetic layer 306 is magnetically "softer" than the second magnetic layer 310. The mismatch in magnetic properties can be obtained by making the first magnetic layer 306 relatively thin as compared to the second magnetic layer 310; by selecting a relatively soft magnetic material for the first magnetic layer 306 and a relatively hard magnetic material for the second magnetic layer 310; or both. Other terms used to describe a "hard layer" include "pinned layer" and "fixed layer." However, it will be understood by one of ordinary skill in the art that the stored magnetic orientation in a hard layer can be varied in accordance with the logical state of the stored data. Other terms used to describe a "soft layer" include "variable layer" and "flipped layer." It will be understood by one of ordinary skill in the art that the GMR stack can further include multiple layers of ferromagnetic materials and spacers.

The GMR cell 300 stores data as a magnetic orientation in the second magnetic layer 310. A relatively high magnetic field is required to switch the magnetization of the second magnetic layer 310 so that the magnetization remains fixed in operation. The magnetic state of the GMR cell 300 is switched by switching the magnetization of the first magnetic layer 306, which can be switched with a relatively low magnetic field generated by applying current to the corresponding word line 302 and the corresponding bit line 304. The resulting magnetization of the first magnetic layer 306 is either parallel or anti-parallel to the magnetization of the second magnetic layer 310. When the magnetization in the first magnetic layer 306 is parallel with the magnetization of the second magnetic layer 310, the electrical resistance of the GMR cell 300 is lower than when the magnetization is relatively is anti-parallel. Current in the word line 302 and/or the bit line 304 can be switched in both directions to correspondingly switch the magnetization of the first magnetic layer 306, i.e., the soft magnetic layer, between parallel and anti-parallel states. The difference in electrical resistance of the bit line 304 is then sensed, thereby allowing the stored logical state of the GMR cell 300 to be retrieved.

Figure 3B:
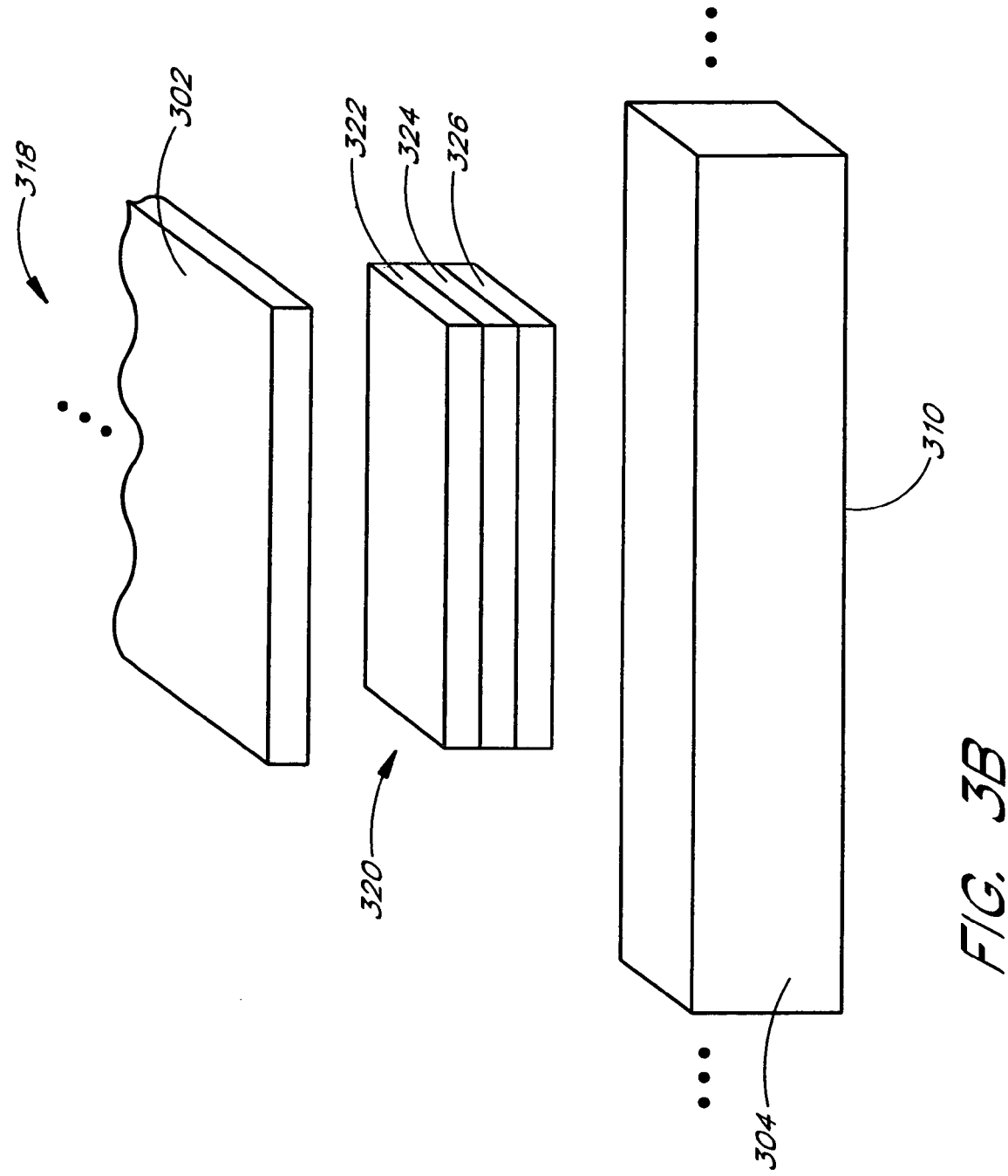
FIG. 3B illustrates a TMR cell in a cross point.

FIG. 3B illustrates a TMR cell 318 in a cross point architecture. In a TMR memory cell, a cell body is formed between the bit line and the word line, and the conductive layer 308 is replaced by a relatively thin insulating layer, which is thin enough to allow the tunneling of electrons from one magnetic layer to the other magnetic layer to detect memory states. The TMR cell 318 includes a TMR cell body 320 that is disposed between the word line 302 and the bit line 304. The TMR cell body 320 includes a first layer of ferromagnetic material 322, a conducting spacer layer 324, and a second layer of ferromagnetic material 326. The conducting spacer layer 324 is disposed between the first layer of ferromagnetic material 322 and the second layer of ferromagnetic material 326.

Figure 4A:
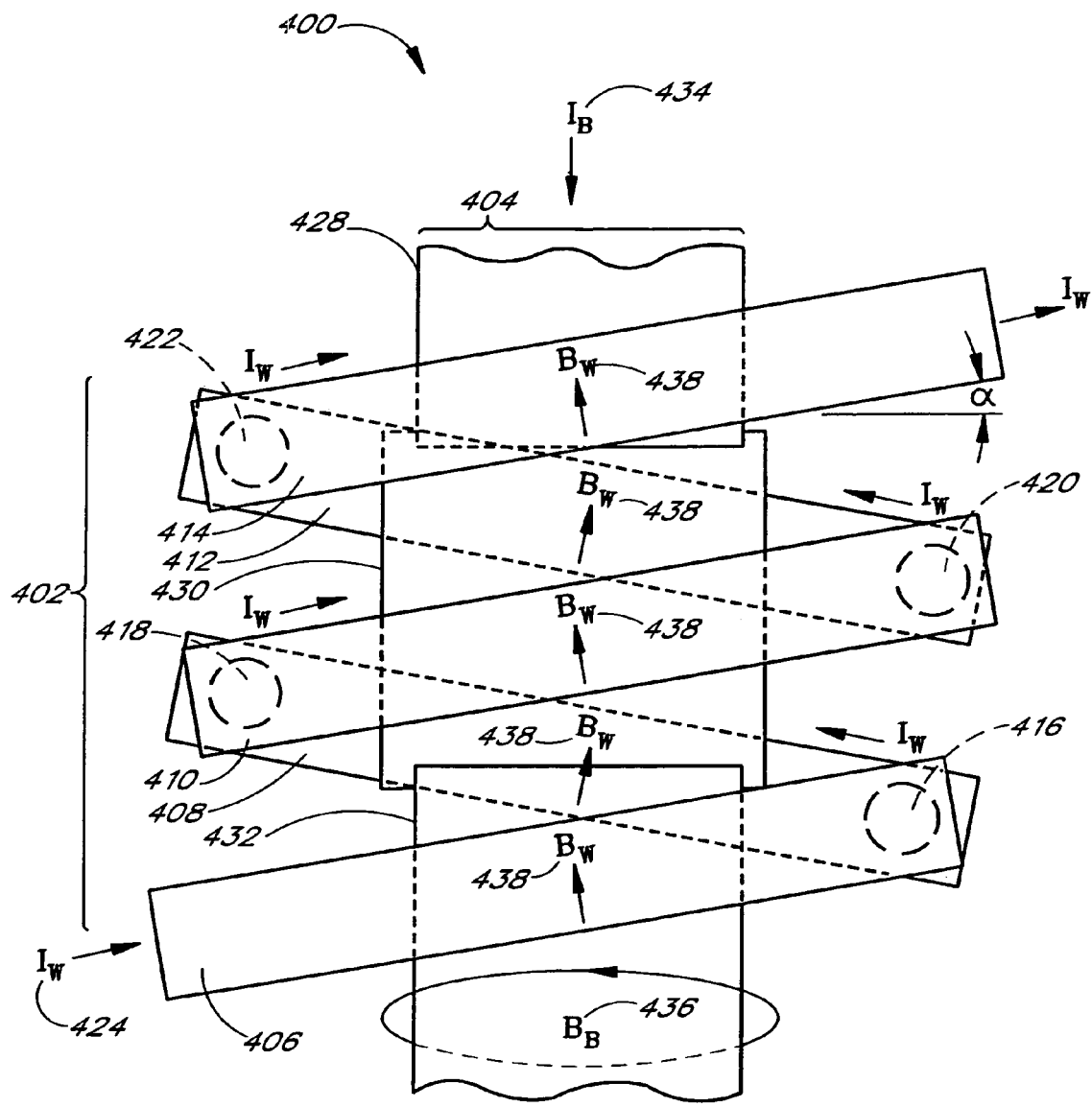
FIG. 4A is a top-down view of a GMR cell configuration according to an embodiment of the invention.

FIG. 4A is a top-down view of a GMR cell configuration 400 according to an embodiment of the invention. The word line configuration illustrated in FIG. 4A is applicable to other types of magnetic memories, such as a TMR cell configuration that is described later in connection with FIG. 4B.

Advantageously, a word line 402 of the GMR cell configuration 400 is configured in a coil-like shape. The coil-like shape of the word line 402 allows the GMR cell configuration 400 to be switched in response to relatively small word currents. This allows a corresponding interface circuit with relatively small device geometries to write to the GMR cell configuration 400. By contrast, a conventional word line for a magnetic memory cell does not wrap around the body of a magnetic memory cell, and the conventional magnetic memory cell often requires a relatively large word current to store data. These large word currents are disadvantageously impractical to provide from interface circuits with desirably small and compact device geometries. In one embodiment, the word line 402 is coupled to a word row line and a word column. Another benefit to the coil-like shape of the word line 402 is an improvement to the write selectivity of the GMR cell configuration 400.

The GMR cell configuration 400 includes the word line 402 and a bit line 404. In a GMR cell, the bit line 404 corresponds to a sense line. The word line 402 further includes multiple segments. The number of segments in the GMR cell configuration 400 can correspond to a broad range. For example, one embodiment of the invention includes a magnetic memory cell with two segments and an interconnecting plug in a via. For example, with only two segments and an interconnecting plug, a word line can wrap around a bit line and/or a cell body by at least about 270 degrees and can cover nearly 360 degrees.

In the illustrated GMR cell configuration 400, the word line 402 includes 5 segments, which are a first segment 406, a second segment 408, a third segment 410, a fourth segment 412, and a fifth segment 414. For clarity, insulating layers are not shown in FIGS. 4A–4D. The first segment 406 couples to the second segment 408 through a first plug 416, which fills an opening or via in a dielectric with a conductor, such as tungsten (W). The second segment 408 couples to the third segment 410 through a second plug 418. The third segment 410 couples to the fourth segment 412 through a third plug 420. The fourth segment 412 couples to the fifth segment 414 through a fourth plug 422. This allows a word current $I_W$ 424 to pass through the segments of the word line 402. The word current $I_W$ 424 produces a word magnetic field $B_W$ 438. It will be understood by one of ordinary skill in the art that the orientation of the word magnetic field $B_W$ 438 varies with the direction of the word current $I_W$ 424.

In one embodiment, the word line 402 is electrically connected to a word row line and a word column line at opposite ends such that the word line 402 can be selectively activated for one cell. The word row line and the word column line are also referred to in the art as a word line and a digit line, respectively. Further details of an array including the word row line and the word column line are described later in connection with FIG. 6.

Advantageously, the multiple segments of the word line 402 increase the magnitude of a magnetic field induced by a word current relative to the magnetic field induced by a word current flowing through a conventional word line without the coil-like shape of the word line 402. This improves the write selectivity to a magnetic memory cell, and in addition, allows a magnetic memory cell or a bit line to be formed with a relatively narrow geometry as compared to conventional magnetic memory cell configurations and bit lines. For example, in one embodiment, the magnetic memory cell or the bit line is formed to a width of about 0.1 micrometers (μm). The 5 segments of the illustrated word line 402 wrap around the bit line 404 by about two and a half (2.5) turns. Where the length of a segment is relatively long compared to the height of an interconnecting plug, there is about half a turn of a winding per segment.

In one embodiment, the segments of a word line are approximately orthogonal to the bit line 404. However, some or all of the segments of the word line can be offset from orthogonality within a relatively broad range. One embodiment in which not all the segments of the word line are offset from orthogonality is described later in connection with FIG. 4D. Preferably, the segments of the word line are offset from orthogonal within a range of approximately 10 degrees to 80 degrees as shown by angle α. More preferably, the offset from orthogonality is maintained within a range of approximately 25 degrees to 75 degrees; Even more preferably, the offset from orthogonality is maintained within a range of approximately 40 degrees to 50 degrees.

The magnetic field from a diagonal arrangement is a vector sum of the magnetic fields induced by the current carried by the conductive lines in the diagonal arrangement. Advantageously, the magnetic field produced by a diagonal arrangement according to one embodiment of the invention can be similar to the magnetic field produced by two orthogonal lines at two field values. In one embodiment, a single coil configuration allows a bit or magnetic cell be cycled without perturbation to the surrounding bits and allows a bit to be cycled using only one line, which can advantageously reduce the number of current drivers in the architecture.

The bit line 404 in a GMR configuration corresponds to a sense line with multiple GMR cells connected in series. The multiple GMR cell bodies can be connected with relatively short conductors. In the illustrated embodiment, the bit line 404 includes a first conductor 428, a GMR cell body 430, and a second conductor 432. The first conductor 428 and the second conductor 432 connect the GMR cell body 430 in series with other cell bodies such that a bit current I$_B$ 434 can flow through multiple cell bodies. The bit current I$_B$ 434 generates a bit magnetic field B$_B$ 436. It will be understood by one of ordinary skill in the art that the orientation of the bit magnetic field B$_B$ 436 varies with the direction of the bit current I$_B$ 434. For the purposes of illustration, the first conductor 428 and the second conductor 432 are shown narrower in width than the GMR cell body 430. However, it will be understood by one of ordinary skill in the art that conductors, such as the first conductor 428 and the second conductor 432, can be wider than or the same width as the GMR cell body 430.

The GMR cell configuration 400 stores data in a magnetic orientation in the GMR cell body 430. The magnetic orientation can be stored by energizing or passing the word current I$_W$ 424 through the word line 402. The direction of the word current I$_W$ 424 determines the direction of the magnetic orientation that is stored in the GMR cell body 430. The magnetic orientation can be stored with or without a current flowing through the bit line 404.

The illustrated GMR cell body 430 can correspond to a variety of modes, including spin valve modes and pseudo spin valve modes. When a fixed magnetic orientation in a hard layer of the GMR cell body 430 is parallel with a variable magnetic orientation in a soft layer of the GMR cell body 430, the resistance of the GMR cell body 430 and the associated bit line is relatively low. When the fixed magnetic orientation in the GMR cell body 430 is anti-parallel with the variable magnetic orientation, the resistance of the GMR cell body 430 and the associated bit line is relatively high.

The segments of the word line 402 form a winding or at least a portion of a winding around the GMR cell body 430. In the illustrated embodiment of the GMR cell configuration 400, the GMR cell body 430 is disposed between the segments of the word line 402 such that the first segment 406, the third segment 410, and the fifth segment 414 are on one side of the GMR cell body 430, and the second segment 408 and the fourth segment 412 are on another side of the GMR cell body 430, i.e., such that the GMR cell body 430 is wound by the word line 402.

Figure 4B:
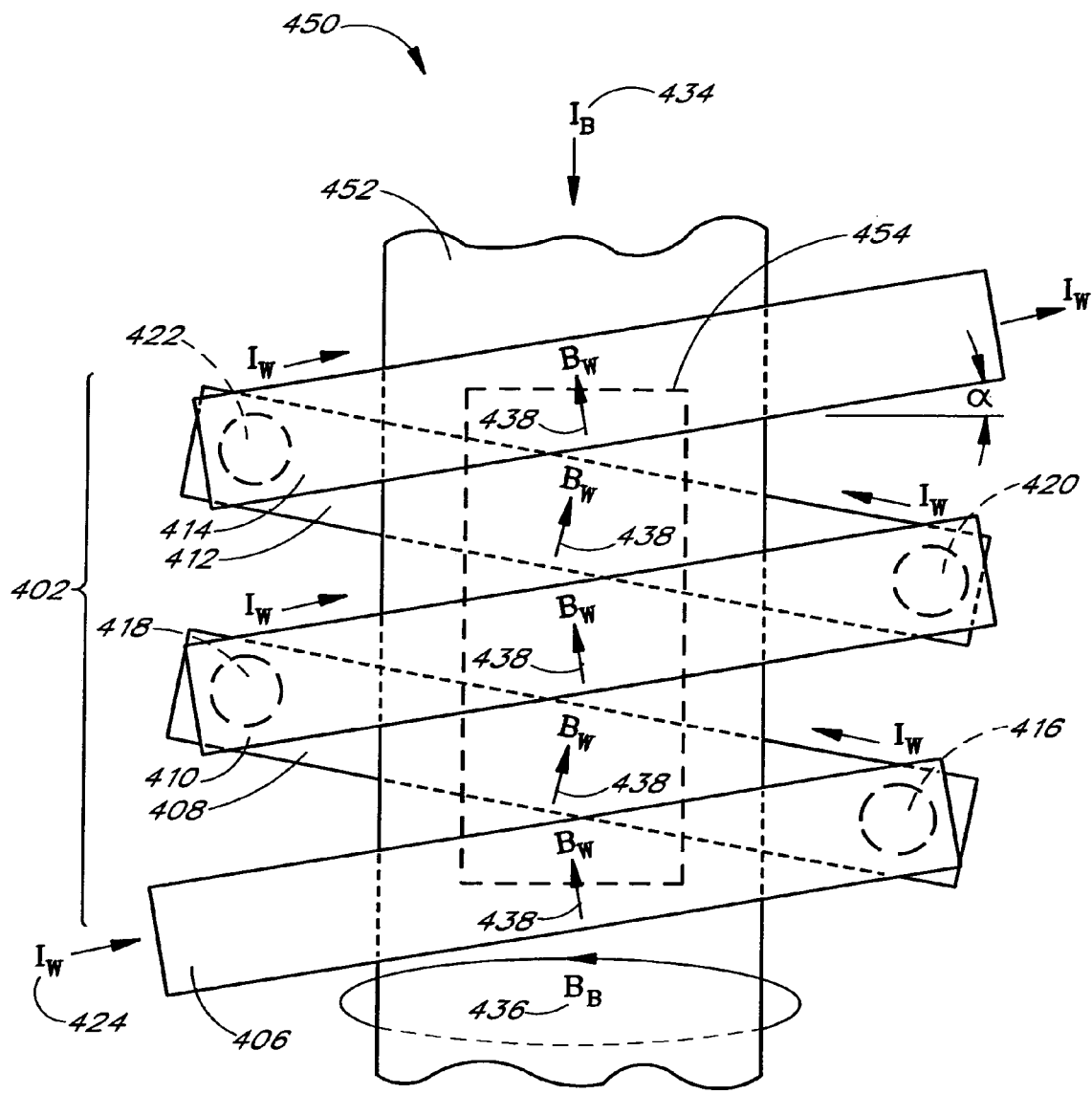
FIG. 4B is a top-down view of a tunneling magneto-resistance (TMR) cell configuration according to an embodiment of the invention.

FIG. 4B is a top-down view of a TMR cell configuration 450 according to an embodiment of the invention. The TMR cell configuration 450 illustrates the applicability of the word line configuration to both GMR and TMR memory types. For clarity, insulating layers are not shown in FIG. 4B. As described earlier in connection with FIG. 4A, the word line 402 wraps around a magnetic memory cell to increase the magnetic field induced by the word current I$_W$ 424. In a TMR configuration, as illustrated in FIG. 4B, the word line 402 wraps around a bit line 452 and a TMR cell body 454. The bit line 452 corresponds to a relatively long conductor. Multiple TMR cell bodies, such as the TMR cell body 454, couple to the bit line 404 at bit line and word line cross points as illustrated later in connection with FIG. 7.

The word line 402 of the TMR cell configuration 450 includes the first segment 406, the second segment 408, the third segment 410, the fourth segment 412, and the fifth segment 414 described earlier in connection with FIG. 4A. The TMR cell body 454 and the bit line 452 are disposed between the segments of the word line 402 such that the first segment 406, the third segment 410, and the fifth segment 414 are on one side of the TMR cell body 454, and the second segment 408 and the fourth segment 412 are on another side of the TMR cell body 454, i.e., such that the TMR cell body 454 is wound by the word line 402.

Figure 4C:
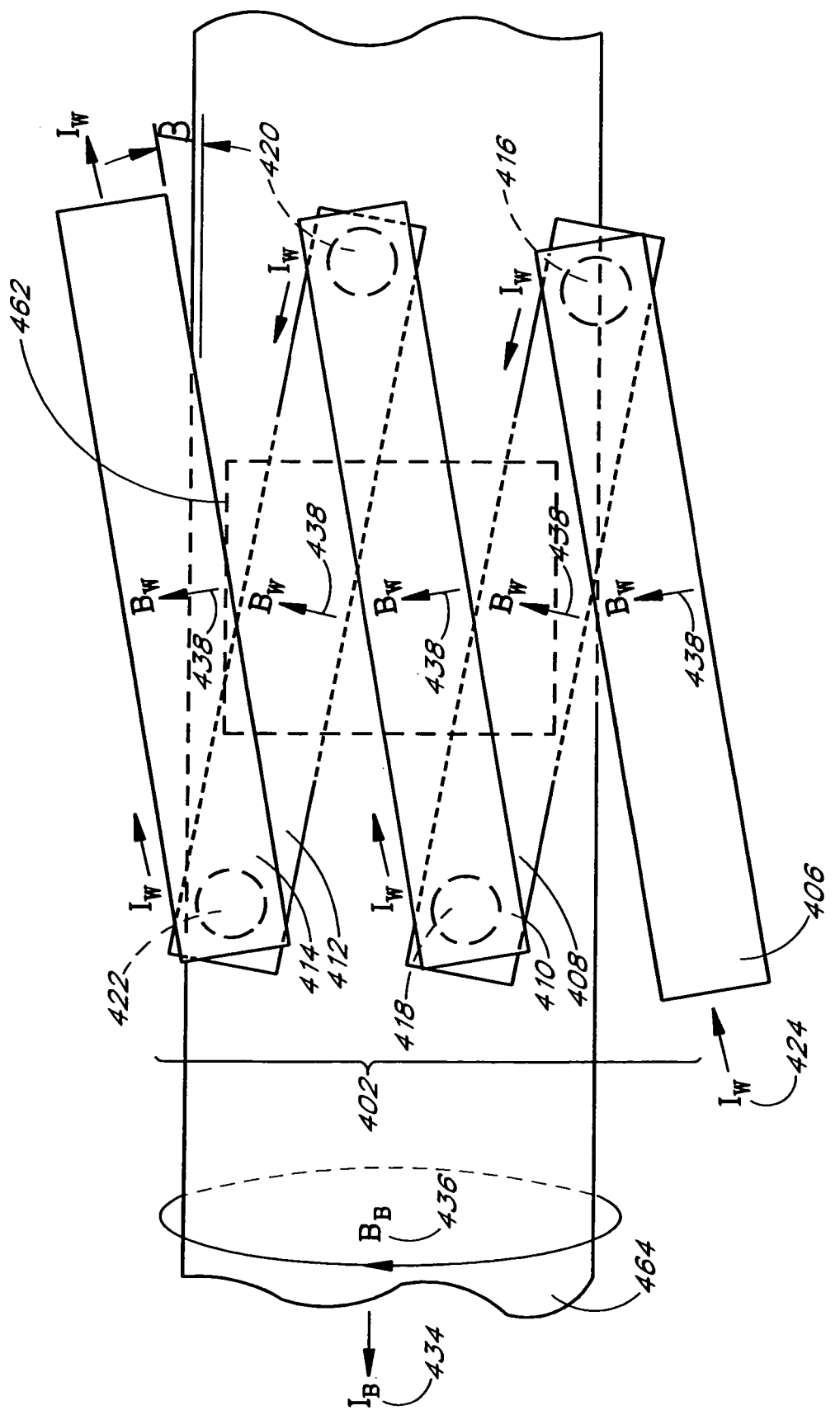
FIG. 4C is a top-down view of a tunneling magneto-resistance (TMR) cell configuration in a cross point according to an embodiment of the invention.

FIG. 4C is a top-down view of a tunneling magneto-resistance (TMR) cell configuration 460 in a cross point according to an embodiment of the invention. The TMR cell configuration 460 includes a TMR cell body 462 disposed between the word line 402 and a bit line 464. The bit current I$_B$ 434 generates the bit magnetic field B$_B$ 436. It will be understood by one of ordinary skill in the art that the orientation of the bit magnetic field B$_B$ 436 will depend on the direction of the bit current I$_B$ 434.

In contrast to the TMR cell configuration 450 described earlier in connection with FIG. 4B, where the bit line 452 is roughly orthogonal to the word line 402 (notwithstanding the angle, α), the bit line 464 of the TMR cell configuration 460 of FIG. 4C is roughly parallel with the word line 402. In the illustrated embodiment of FIG. 4C, the segments of the word line 402 are offset from parallel with the bit line 464 by an angle β.

The bit line 464 passes through the segments of the word line 402. In the illustrated embodiment, the TMR cell body 462 is disposed between the bit line 464 and the second segment 408 and the fourth segment 412 of the word line 402. The bit line 464 can be made from multiple relatively small conductors or can be made from a relatively large conductor as shown in FIG. 4C. Where the bit line 464 corresponds to a relatively large conductor, at least one of the first plug 416, the second plug 418, the third plug 420, and the fourth plug 422 can be configured to pass through the bit line 464 without making electrical contact with the bit line 464 with the addition of insulation between the plugs and the bit line 464.

Figure 4D:
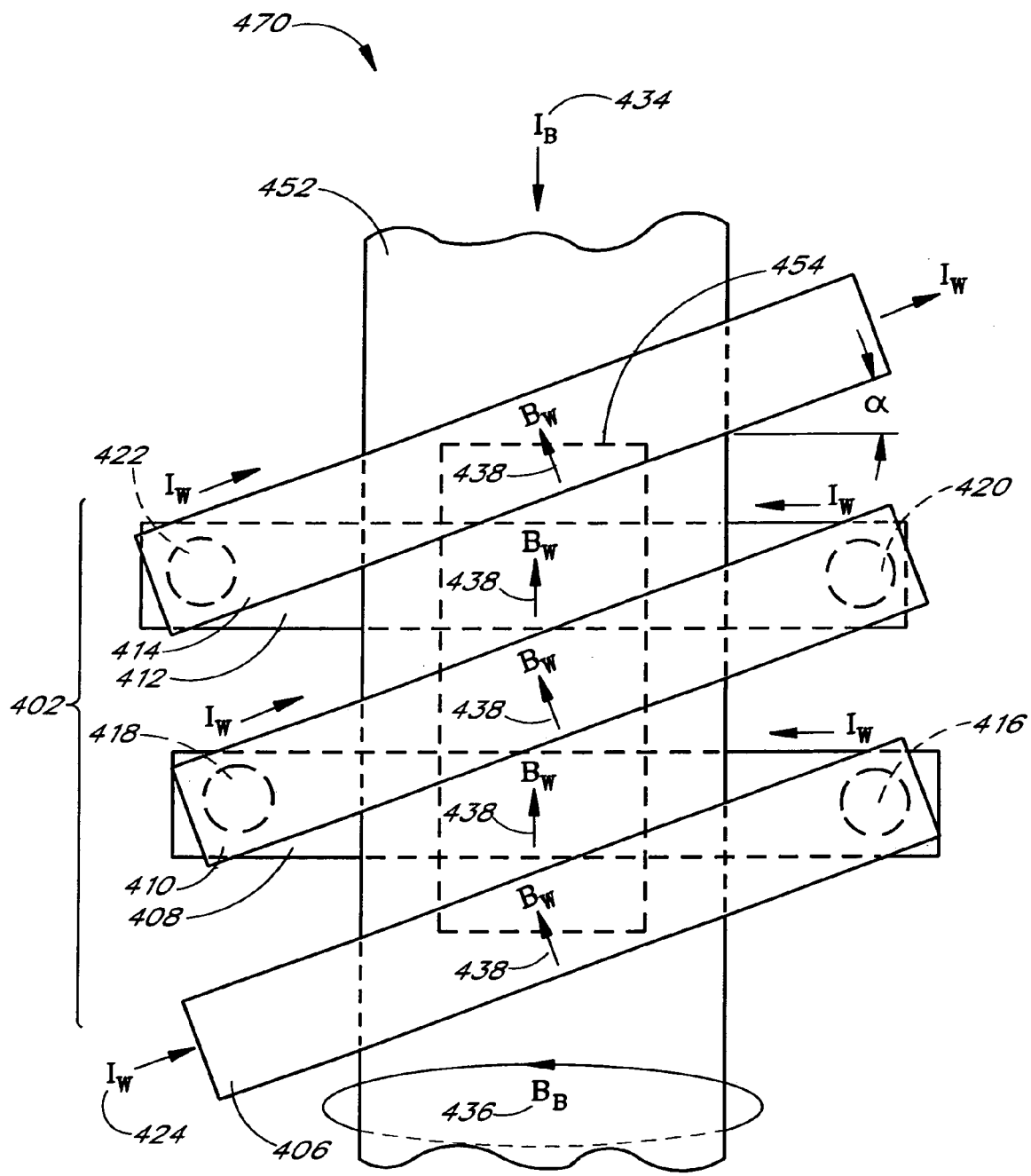
FIG. 4D is a top-down view of a tunneling magneto-resistance (TMR) cell configuration according to an embodiment of the invention.

FIG. 4D is a top-down view of a tunneling magnetoresistance (TMR) cell configuration 470 according to an embodiment of the invention. In the illustrated embodiment, some of the segments of the word line 402 are offset from orthogonality with the bit line 452, while other segments of the word line 402 are approximately orthogonal to the bit line 452. For example, the first segment 406, the third segment 410, and the fifth segment 414 are offset from orthogonality with respect to the bit line 452 by an angle α. The second segment 408 and the fourth segment 412 are approximately orthogonal to the bit line 452. The segments of the word line 402 can be arranged so that the word magnetic field $B_W$ 438 corresponds to a desired configuration.

Figure 5:
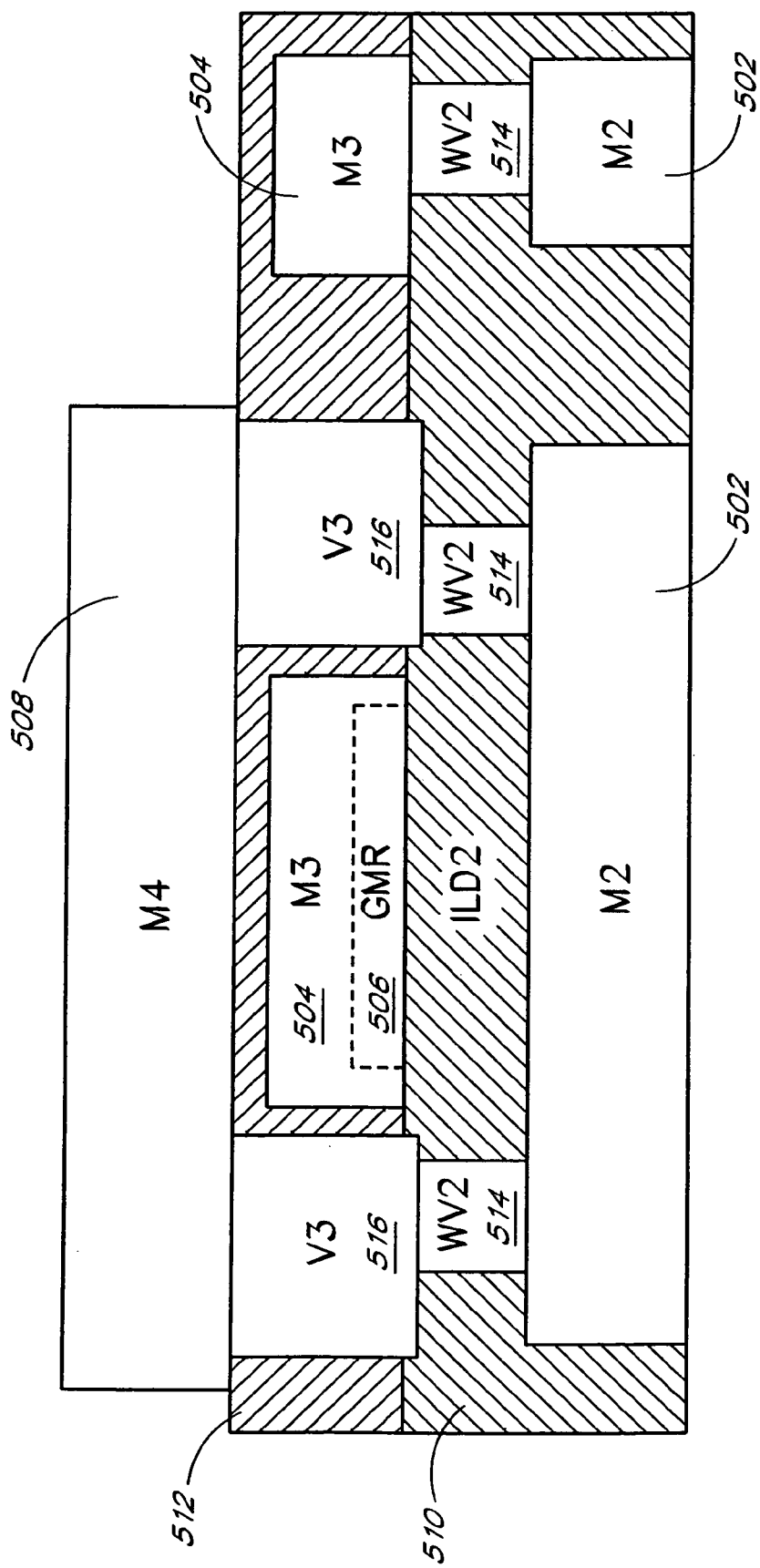
FIG. 5 is a cross-sectional view of a GMR cell configuration according to an embodiment of the invention.

FIG. 5 is an exemplary cross-sectional view of a GMR cell configuration according to an embodiment of the invention. An example of a cross-sectional view of a TMR cell configuration according to an embodiment of the invention will be described later in connection with FIG. 7. FIG. 5 illustrates a first metal layer M2 502 from which the second segment 408 and the fourth segment 412 of the word line 402 described earlier in connection with FIG. 4A can be formed.

A second metal layer M3 504 can be used to form the first conductor 428 and the second conductor 432 described earlier in connection with FIG. 4A. A bit line is formed by the series connection of a plurality of GMR cells, as shown by a GMR cell 506 and by a plurality of conductors, such as the first conductor 428 and the second conductor 432 described earlier in connection with FIG. 4A. The second metal layer M3 504 can also be used to connect the word line 402 (FIG. 4A) to a word column line as will be described later in connection with FIG. 6.

A third metal layer M4 508 can be used to form the first segment 406, the third segment 410, and the fifth segment 414 of the word line 402 described earlier in connection with FIG. 4A.

A first dielectric layer ILD2 510 and a second dielectric layer 512 isolate a bit line formed by the conductors of the second metal layer M3 504 from a word line that is formed by the segments in the first metal layer M2 502 and in the third metal layer M4 508. A first set of plugs WV2 514 allows connection to conductors in the first metal layer M2 502 and to conductors or other plugs in the second metal layer M3 504 through openings or vias in the first dielectric layer ILD2 510. The first set of plugs WV2 514, can be made from, for example, tungsten (W). A second set of plugs V3 516 connects the first set of plugs WV2 514 to conductors in the third metal layer M4 508 through openings or vias in the second dielectric layer 512. A plug from the first set of plugs WV2 514 and a plug from the second set of plugs V3 516 can together form another plug, such as the first plug 416 described earlier in connection with FIG. 4A. A plug from the first set of plugs WV2 514 can also be used to connect a segment of a word line to a word column line as will be described later in connection with FIG. 6.

Figure 6:
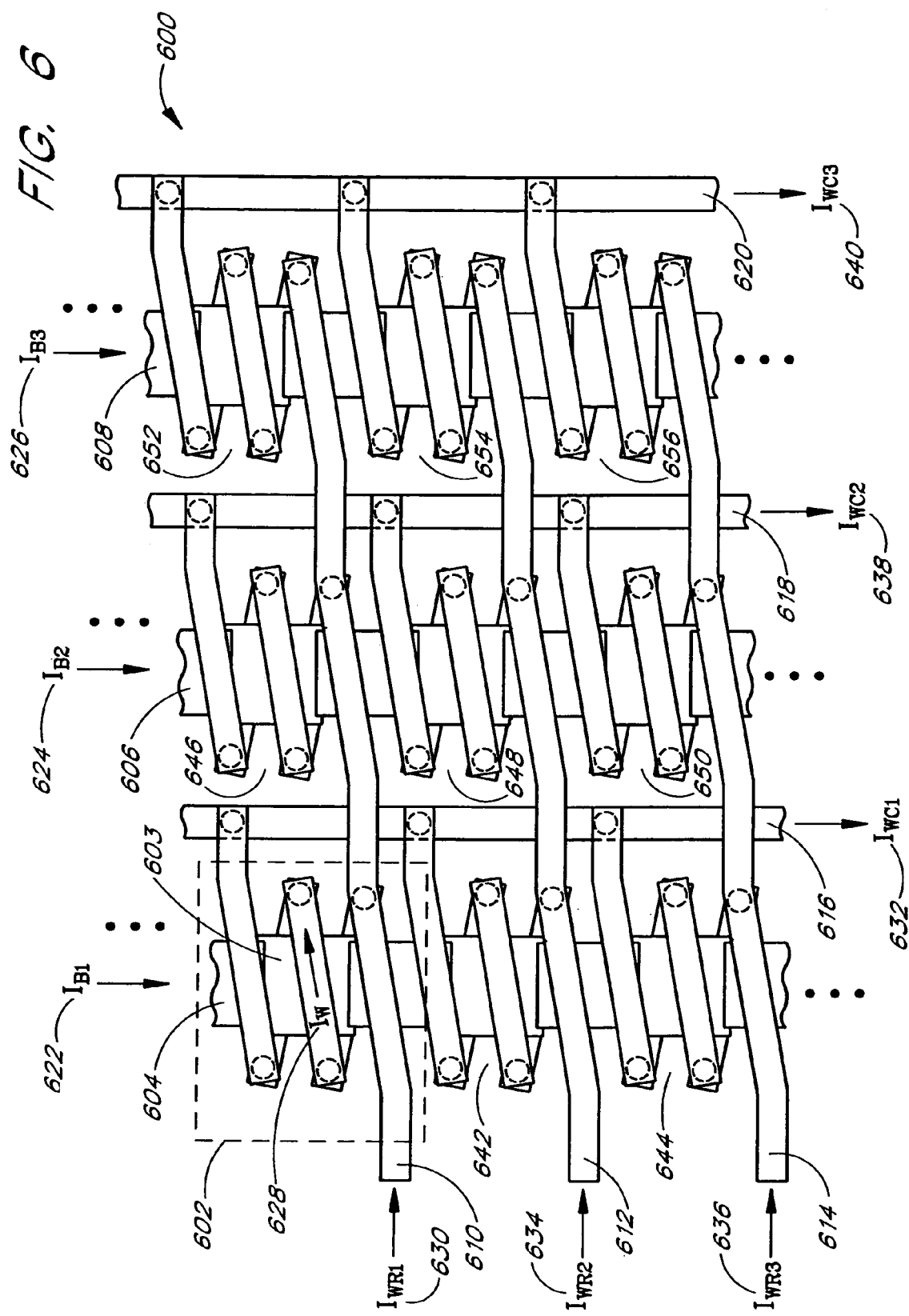
FIG. 6 illustrates a memory configuration of multiple magnetic memory cells according to an embodiment of the invention.

FIG. 6 illustrates a portion of a memory configuration 600 of multiple magnetic memory cells according to an embodiment of the invention. For clarity, insulating layers are not drawn in FIG. 6. The magnetic memory cells can correspond to a variety of magnetic memory types, including GMR cells, TMR cells, and the like. The memory configuration 600 of FIG. 6 uses GMR cells for the magnetic memory cells. An embodiment of a memory configuration with TMR cells will be described later in connection with FIG. 8. Although only about 9 magnetic memory cells are shown in the illustrated portion of the memory configuration 600, the skilled practitioner will appreciate that the memory configuration 600 can correspond to an arbitrarily selected size or number of magnetic memory cells. The illustrated memory configuration 600 advantageously allows an arrangement in an array of a plurality of magnetic memory cells with wound or coil-like shaped word lines, such as the GMR cell configuration 400 described earlier in connection with FIG. 4A.

The memory configuration 600 includes a plurality of magnetic memory cells. An example of a magnetic memory cell from the plurality of magnetic memory cells is a first magnetic memory cell 602, which includes a cell body 603. A magnetic memory cell, such as the first magnetic memory cell 602, is selected for writing or reading from other magnetic memory cells by applying both word current and bit current to the magnetic memory cell. Of course, multiple magnetic memory cells can be simultaneously selected to write or read multiple bits of data simultaneously. Multiple bit lines, multiple word row lines, and multiple word column lines are provided to enable the selection of a magnetic memory cell.

The illustrated portion of the memory configuration 600 includes a first bit line 604, a second bit line 606, and a third bit line 608. For reference with respect to FIG. 6, the bit lines will be referred to herein as arranged in columns. The illustrated portion of the memory configuration 600 also includes a first word row line 610, a second word row line 612, and a third word row line 614. The illustrated portion of the memory configuration 600 further includes a first word column line 616, a second word column line 618, and a third word column line 620.

The first bit line 604, the second bit line 606, and the third bit line 608 carry a first bit current $I_{B1}$ 622, a second bit current $I_{B2}$ 624, and a third bit current $I_{B3}$ 626, respectively. The amount of current in the first bit current $I_{B1}$ 622, the second bit current $I_{B2}$ 624, and the third bit current $I_{B3}$ 626 can be the same. A bit current may be carried in a bit line from which a cell not intended to be selected, written, or read, so long as corresponding word lines are not activated. In addition, where multiple bits are written to or read from at the same time, multiple bit lines can be desirably simultaneously activated. However, it will be understood by one of ordinary skill in the art that the direction of the current in a bit line and/or word line can vary when storing data in accordance with the logical state of the data. Of course, where a bit line does not contain a cell from which data is intended to be stored and/or retrieved, the bit current can be deactivated to save power.

To select a particular magnetic memory cell from a plurality of magnetic memory cells in the memory configuration 600, the particular magnetic memory cell's word line is activated. In the illustrated memory configuration 600, a word line for a cell is activated by applying current through the cell's corresponding word row line and the cell's corresponding word column line. For example, to select the first magnetic memory cell 602, the first word row line 610, and the first word column line 616 are activated to carry a word current $I_W$ 628. For example, the word current $I_W$ 628 can be carried within a first word row current $I_{WR1}$ 630 by the first word row line 610 to the first magnetic memory cell 602, where the word current $I_W$ 628 winds through the coil-like windings of the first magnetic memory cell 602, and to the first word column line 616, where the word current $I_W$ 628 is carried away by a first word column current $I_{WC1}$ 632. In this example, the word current $I_W$ 628, the first word row current $I_{WR1}$ 630, and the first word column current $I_{WC1}$ 632 carry the same amount of current. However, the skilled practitioner will appreciate that where more than one magnetic memory cell in the memory configuration 600 is selected at a time, more than one word current can be carried by a word row line or a word column line and correspondingly, more than one word current can be included in a word row current or a word column current.

FIG. 6 illustrates other magnetic memory cells. A second magnetic memory cell 642 and a third magnetic memory cell 644 are shown in FIG. 6. The second magnetic memory cell 642 and the third magnetic memory cell 644 share the first bit line 604 with the first magnetic memory cell 602 and are coupled to the first word column line 616. A fourth magnetic memory cell 646, a fifth magnetic memory cell 648, and a sixth magnetic memory cell 650 share the second bit line 606 and are coupled to the second word column line 618. A seventh magnetic memory cell 652, an eighth magnetic memory cell 654, and a ninth magnetic memory cell 656 share the third bit line 608 and are coupled to the third word column line 620. The first word row line 610 is coupled to the first magnetic memory cell 602, the fourth magnetic memory cell 646, and the seventh magnetic memory cell 652. The second word row line 612 is coupled to the second magnetic memory cell 642, the fifth magnetic memory cell 648, and the eighth magnetic memory cell 654. The third word row line 614 is coupled to the third magnetic memory cell 644, the sixth magnetic memory cell 650, and the ninth magnetic memory cell 656.

Other magnetic memory cells can be selected by, for example, activation of corresponding word currents through the application of other word row currents such as a second word row current $I_{WR2}$ 634 or a third word row current $I_{WR3}$ 636, and by application of other word column currents such as a second word column current $I_{WC2}$ 638 or a third word column current $I_{WC3}$ 640. Magnetic memory cells that are not intended to be read should not have both their corresponding word row line and word column line activated. In addition, only one magnetic memory cell per bit line should be selected at a time. In some arrangements, bit line current can also be activated to aid switching.

Figure 7:
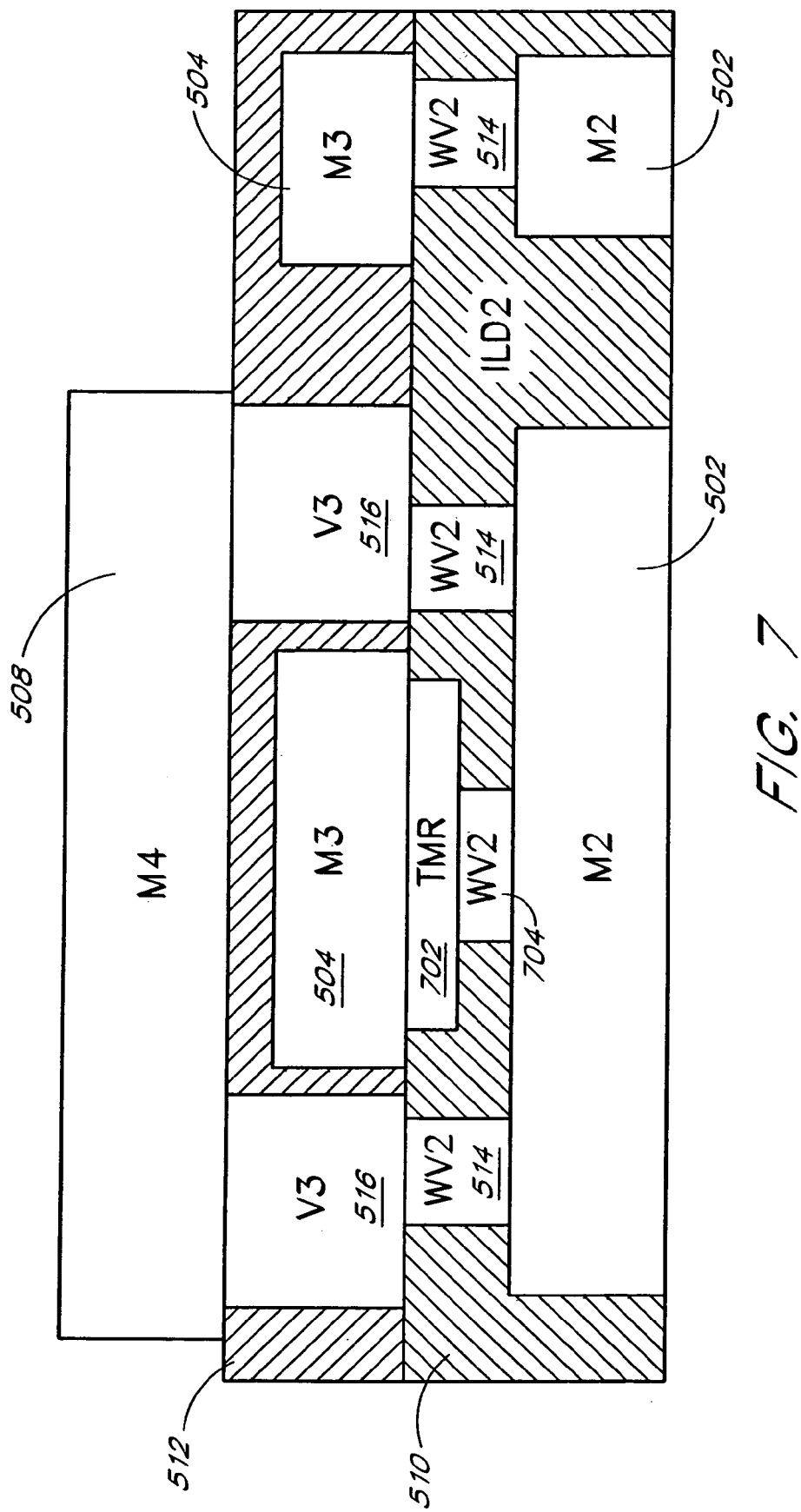
FIG. 7 is a cross-sectional view of a TMR cell configuration according to an embodiment of the invention.

FIG. 7 is a cross-sectional view of a TMR cell configuration according to an embodiment of the invention. The configuration illustrated in FIG. 7 is similar to the configuration illustrated in FIG. 5 with a TMR cell substituting for the GMR cell. The cross-section view illustrates the first metal layer M2 502 from which the second segment 408 and the fourth segment 412 of the word line 402 described earlier in connection with FIG. 4B can be formed. A TMR cell body 702 is electrically connected to both a portion of a word line, such as the word line 402 of FIG. 4B, and a bit line, such as the bit line 452 of FIG. 4B.

In the illustrated TMR cell configuration, a plug 704 electrically connects a word line formed in the first metal layer M2 502 to the TMR cell body 702. In another embodiment, the word line formed in the first metal layer M2 502 electrically connects to the TMR cell body 702 through a contact without a plug.

The bit line, such as the bit line 452 of FIG. 4B, can be formed from the second metal layer M3 504. A bit line is coupled to a plurality of TMR cells, which are coupled to word lines at cross points. The second metal layer M3 504, can also be used to form a word column line, a cross section of which is drawn to the far right of FIG. 7. The word column line, such as the first word column line 616 described in connection with FIGS. 6 and 8, can be used with a word row line, such as the first word row line 610 described in connection with FIGS. 6 and 8, to select a TMR cell. In an arrangement described later in connection with FIG. 9, a word line wraps through multiple cell bodies and is activated by a single word line, rather than by both a word column line and a word row line.

The third metal layer M4 508 can be used to form the first segment 406, the third segment 410, and the fifth segment 414 of the word line 402 described earlier in connection with FIGS. 4 and 5.

The first dielectric layer ILD2 510 and the second dielectric layer 512 isolate a bit line formed by the conductors of the second metal layer M3 504 from a word line that is formed by the segments in the first metal layer M2 502 and in the third metal layer M4 508. The first set of plugs WV2 514 allow connection to conductors in the first metal layer M2 502 and to conductors or other plugs in the second metal layer M3 504. The second set of plugs V3 516 connects the first set of plugs WV2 514 to conductors in the third metal layer M4 508. A plug from the first set of plugs WV2 514 and a plug from the second set of plugs V3 516 can together form another plug such as the first plug 416 described earlier in connection with FIG. 4B. A plug from the first set of plugs WV2 514 can also be used to connect a segment of a word line to a word column line as described earlier in connection with FIG. 6.

Figure 8:
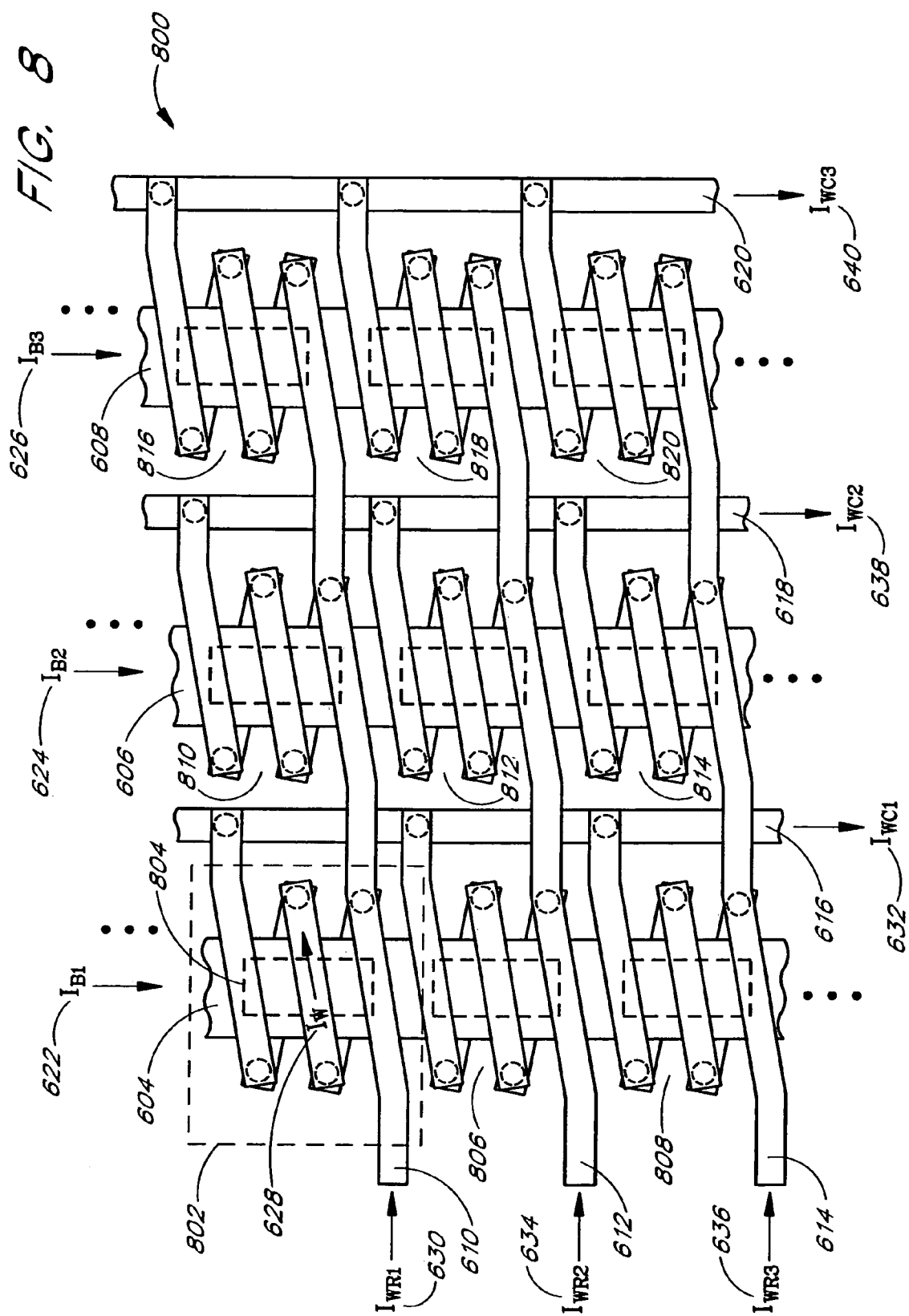
FIG. 8 illustrates a memory configuration of multiple magnetic memory cells according to an embodiment of the invention.

FIG. 8 illustrates a memory configuration 800 for multiple magnetic memory cells according to an embodiment of the invention. For clarity, insulating layers are not shown in FIG. 8. The memory configuration 800 shown in FIG. 8 is related to the memory configuration 600 shown in FIG. 6, but has multiple TMR cells instead of multiple GMR cells. The memory configuration 800 is drawn with 9 magnetic memory cells. However, it will be understood by one of ordinary skill in the art that the number of magnetic memory cells in the memory configuration 800 can correspond to a very broad range.

The memory configuration 800 includes a first magnetic memory cell 802 with a TMR cell body 804. The TMR cell body 804 is disposed between the first bit line 604 and the word line that wraps around the TMR cell body 804, as described earlier in connection with the TMR cell body 702 of FIG. 7. The first magnetic memory cell 802, a second magnetic memory cell 806, and a third magnetic memory cell 808 share the first bit line 604. A fourth magnetic memory cell 810, a fifth magnetic memory cell 812, and a sixth magnetic memory cell 814 share the second bit line 606. A seventh magnetic memory cell 816, an eighth magnetic memory cell 818, and a ninth magnetic memory cell 820 share the third bit line 608. The first bit line 604, the second bit line 606, and the third bit line 608 carry the first bit current $I_{B1}$ 622, the second bit current $I_{B2}$ 624, and the third bit current $I_{B3}$ 626, respectively. The bit currents, together with word currents, such as the word current $I_W$ 628, can be used to read and/or to write to a magnetic memory cell.

As described earlier in connection with FIG. 6, a particular magnetic memory cell from the plurality of magnetic memory cells is selected by the application of word current and bit current to the cell's word line and the cell's bit line, respectively. For example, the word current $I_W$ 628. for the first magnetic memory cell 602 can be selected by activating the first word row current $I_{WR1}$ 630 and by activating the first word column current $I_{WC1}$ 632. The first bit line 604 carries the first bit current $I_{B1}$ 622 for the first magnetic memory cell 802. A word current for more than one word line can be carried by a word row line, e.g., the first word row current $I_{WR1}$ 630 can include word currents for the first magnetic memory cell 802 and the fourth magnetic memory cell 810. However, only one magnetic memory cell per bit line should be selected for reading or writing at a time. Also, a magnetic memory cell that is not intended to be read from or written to should not be activated.

Figure 9:
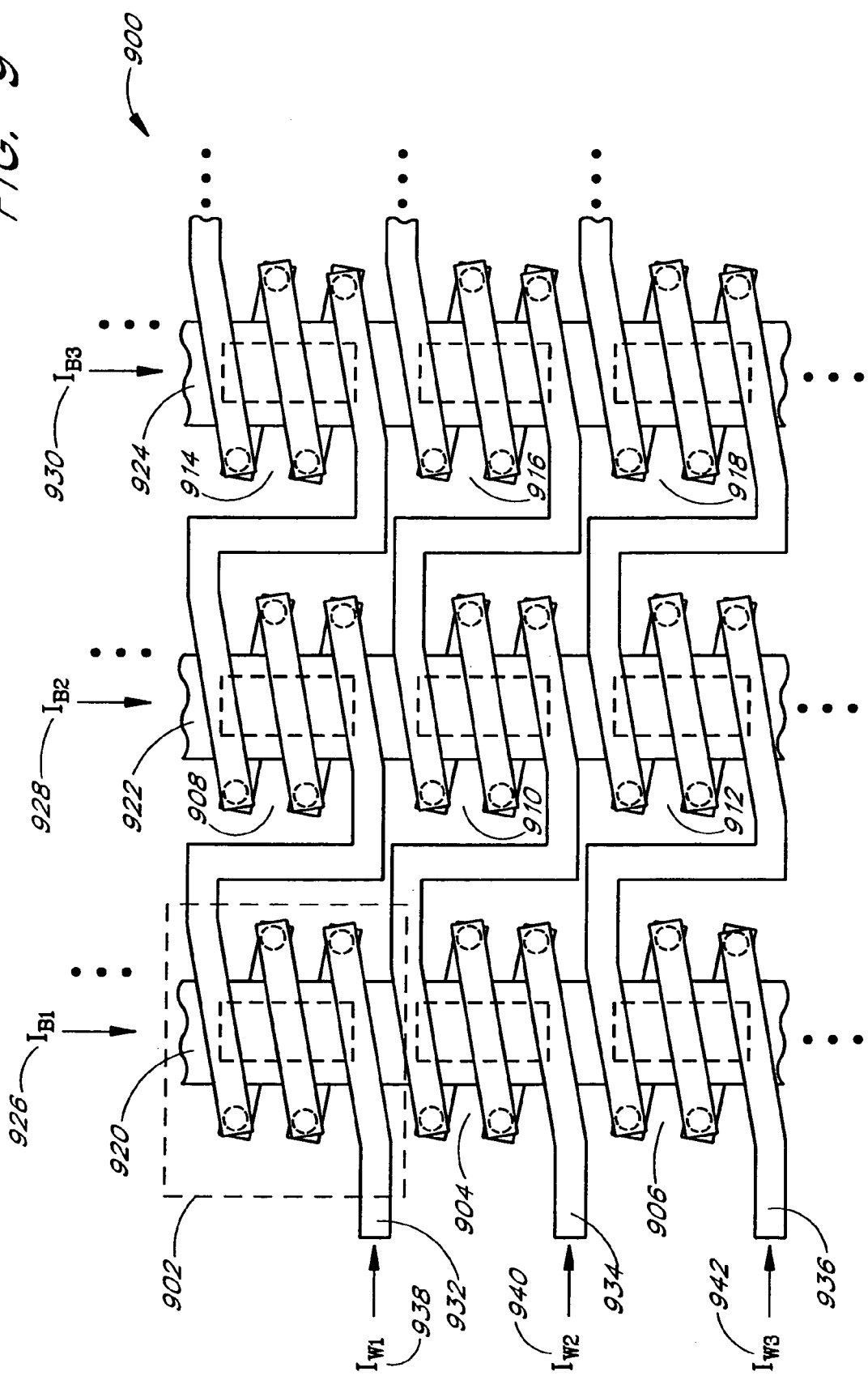
FIG. 9 illustrates a memory configuration of multiple magnetic memory cells arranged in a cross point manner according to an embodiment of the invention.

FIG. 9 illustrates a memory configuration 900 of multiple magnetic memory cells arranged in a cross point manner according to an embodiment of the invention. Advantageously, the memory configuration 900 permits the selection of a memory cell within the array without the need to select both a word row line and a word column line to activate a word line. Although the magnetic memory cells shown in FIG. 9 correspond to TMR cells, it will be understood by the skilled practitioner that the magnetic memory cells can also correspond to GMR cells.

The memory configuration 900 of FIG. 9 illustrates only about 9 magnetic memory cells. However, it will be understood by one of ordinary skill in the art that the memory configuration 900 can correspond to an arbitrarily selected size or number of magnetic memory cells. The memory configuration 900 includes a first magnetic memory cell 902, a second magnetic memory cell 904, and a third magnetic memory cell 906. The first magnetic memory cell 902, the second magnetic memory cell 904, and the third magnetic memory cell 906 share a first bit line 920, which can carry a first bit current $I_{B1}$ 926. A fourth magnetic memory cell 908, a fifth magnetic memory cell 910, and a sixth magnetic memory cell 912 share a second bit line 922, which can carry a second bit current $I_{B2}$ 928. A seventh magnetic memory cell 914, an eighth magnetic memory cell 916, and a ninth magnetic memory cell 918, share a third bit line 924, which can carry a third bit current $I_{B3}$ 930.

A first word line 932 can carry a first word current $I_{W1}$ 938. The illustrated first word line 932 forms the word line for the first magnetic memory cell 902, the fourth magnetic memory cell 908, and the seventh magnetic memory cell 914. When activated, the first word current $I_{W1}$ 938 is applied as a word current to all of the first magnetic memory cell 902, the fourth magnetic memory cell 908, and the seventh magnetic memory cell 914. The second word line 934, forms the word line for the second magnetic memory cell 904, the fifth magnetic memory cell 910, and the eighth magnetic memory cell 916. The third word line 936 forms the word line for the third magnetic memory cell 906, the sixth magnetic memory cell 912, the ninth magnetic memory cell 918.

To select a magnetic memory cell from the plurality of magnetic memory cells, the word current and the bit current for the magnetic memory cell's word line and bit line, respectively, are activated. For example, to select the first magnetic memory cell 902, the first word current $I_{W1}$ 938 and the first bit current $I_{B1}$ 926 are activated. It will be understood by one of ordinary skill in the art that only one magnetic memory cell per bit line should be activated at a time.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A method of producing a magnetic memory cell comprising:
   forming at least a first segment of a conductive word line in a first layer, where the first segment is on a first side of a bit line, where the magnetic memory cell forms part of the bit line;
   forming at least a second segment of the conductive word line in a second layer, where the second segment is on an opposite side of the bit line such that the bit line is disposed between the first segment and the second segment; and
   forming at least one plug electrically coupling the first segment to the second segment, where the first segment and the second segment form an angle of at least 10 degrees at the plug with respect to each other.

2. The method as defined in claim 1, wherein the memory cell is a giant magneto-resistance (GMR) memory cell.

3. The method as defined in claim 1, wherein the memory cell is a tunneling magneto-resistance (TMR) memory cell.

4. The method as defined in claim 1, further comprising forming the first segment such that it is electrically coupled to a word row line at a first end opposite to a second end that is coupled to the second segment by the plug.

5. The method as defined in claim 1, further comprising forming the first segment such that it is electrically coupled to a word column line at a first end opposite to a second end that is coupled to the second segment by the plug.

6. The method as defined in claim 1, wherein the bit line comprises a plurality of memory cells arranged in series.

* * * * *